US008318254B2

(12) United States Patent
Sung et al.

(10) Patent No.: US 8,318,254 B2
(45) Date of Patent: Nov. 27, 2012

(54) METALLIZATION ON A SURFACE AND IN THROUGH-HOLES OF A SUBSTRATE AND A CATALYST USED THEREIN

(75) Inventors: Yuh Sung, Taoyuan (TW); Ming-Der Ger, Taoyuan (TW); Chang-Ping Chang, Taoyuan (TW); Chun-Chieh Tseng, Taoyuan (TW); Wen-Ding Chen, Taoyuan (TW)

(73) Assignee: National Defense University (TW)

( * ) Notice: Subject to any disclaimer, the term of this patent is extended or adjusted under 35 U.S.C. 154(b) by 947 days.

(21) Appl. No.: 12/289,542

(22) Filed: Oct. 30, 2008

(65) Prior Publication Data

US 2010/0075026 A1    Mar. 25, 2010

(30) Foreign Application Priority Data

Sep. 23, 2008   (TW) ............................... 97136550 A

(51) Int. Cl.
*B05D 1/36* (2006.01)
*B05D 5/00* (2006.01)
(52) U.S. Cl. ..... 427/261; 427/97.4; 427/97.6; 427/98.5; 427/99.5; 427/305

(58) Field of Classification Search ................. 427/97.4, 427/97.6, 98.5, 99.5, 261, 302, 305
See application file for complete search history.

(56) References Cited

U.S. PATENT DOCUMENTS

| | | | | |
|---|---|---|---|---|
| 5,300,140 A | * | 4/1994 | Wolf et al. | 106/1.11 |
| 2004/0146647 A1 | * | 7/2004 | Fixter et al. | 427/256 |
| 2006/0228550 A1 | * | 10/2006 | Ou et al. | 428/402 |

* cited by examiner

*Primary Examiner* — Linda L Gray
(74) *Attorney, Agent, or Firm* — Bacon & Thomas, PLLC

(57) ABSTRACT

A copolymer deposited with particles of catalytic metal is disclosed in the present invention, which is formed from an ethylenically unsaturated monomer and a hydrophilic monomer, and the catalytic metal is Au, Ag, Pd, Pt or Ru. The copolymer is hydrophilic when the temperature is lower than a specific temperature, and will become hydrophobic when the temperature is greater than the specific temperature. The present invention also discloses a method for forming a metal layer on a substrate via electroless plating, which includes contacting the substrate with an ink composition, drying the ink composition on the substrate, and contacting the dried ink composition with an electroless plating solution, wherein the ink composition contains the copolymer of the present invention in an aqueous phase. The present invention further discloses a method for forming metal conductors in through holes of a substrate.

14 Claims, 4 Drawing Sheets

METALLIZATION ON A SURFACE AND IN THROUGH-HOLES OF A SUBSTRATE AND A CATALYST USED THEREIN

FIELD OF THE INVENTION

The present invention is related to a technique of metallization on a surface and in through holes of a substrate and a catalyst used therein, and in particular to a technique of metallization by electroless plating.

BACKGROUND OF THE INVENTION

In U.S. patent application Ser. No. 11/979,760, filed 8 Nov. 2008, some of the inventors of the present application and their co-workers disclose a method for forming a metal pattern on a substrate via printing and electroless plating, which utilizes an ink composition comprising catalytic metals to print a pattern on a substrate, and then forms a metal film on the printed pattern via electroless plating. The ink composition used in this prior art method comprises a sulfate terminated ($SO_4^-$) polymer having a hydrophilic functional group, wherein the polymer can be used as a reducing agent and a dispersing agent simultaneously, so that catalytic metal ions may be reduced to atoms and homogenously dispersed in the ink composition before and after printing. Details of the disclosure in this US patent application are incorporated herein by reference.

The ink composition used in the aforesaid U.S. patent application Ser. No. 11/979,760 contains a water swellable resin as a binder enhancing the binding strength between the metal layer and the substrate. A suitable binder is a polymer having a hydrophilic moiety and a hydrophobic moiety, such as is poly(tetrafluoroethylene) sulfonate or polystyrene sulfonate. The inventors of the present application have been working on an ink composition for use in a method for forming a metal pattern on a substrate, which is free from a binder or a polymer having a hydrophilic functional group.

There are two types of plated-through-hole (abbreviated as PTH) technologies at the present, which are (a) electroplating with a conductive layer containing carbon black, graphite, conductive polymer or a mixture thereof formed on the through holes; and (b) electroless plating with a catalyst layer containing a catalytic metal such as Pd adsorbed on the through holes. The type (a) PTH technology requires an addition of a dispersing agent for the carbon black or graphite to be well dispersed in a solvent, or an addition of a binder agent which is thermally decomposable to enhance the adsorption of the carbon black or graphite to the substrate. The type (a) PTH technology also suffers drawbacks such as a low metal deposition ratio during the electroplating and non-uniform metal layers formed on the walls of the through holes.

Taiwan patent number I276702, issued 21 Mar. 2007, discloses an electroless plating process using a palladium nanocolloidal hydrophobic dispersion in an organic solvent such as n-hexane or cyclohexane as an activator for the electroless plating or related metal catalyzed reactions. The palladium nanocolloidal dispersion is prepared by reacting an ionic surfactant dissolve in water as a particle stabilizer, reducing agent and phase transfer emulsifier with palladium acetate under refluxing at 90-130° C. for 6-24 hours, recovering the upper layer of the reaction mixture containing palladium nanocolloids, and diluting the recovered upper layer in a low polarity organic solvent such as n-hexane or cyclohexane. The ionic surfactant used are those containing sulphate group ($SO_4^{2-}$) or sulfonic group ($SO_3^-$). The palladium nanocolloidal dispersion prepared in this prior art involves a long and high temperature reaction, and an organic solvent, which are not environment friendly, and thus there are still rooms for improvements.

Poly(N-isopropylacrylamide) (abbreviated as PNIPAAm) is well known to be a water-soluble and hydrophilic polymer, that exhibits an extended chain conformation below the lower critical solution temperature (LCST) when it is in aqueous solution. PNIPAAm can also undergo a phase transition to an insoluble and hydrophobic aggregate above its LCST. The LCST of PNIPAAm is between 28-35° C. Randomly copolymerizing a small proportion of a different co-monomer in PNIPAAm copolymers raises the LCST. This is because the copolymerized co-monomer reduces the aggregation ability of the isopropyl group in the e PNIPAAm.

SUMMARY OF THE INVENTION

A primary objective of the present invention is to propose a method for forming a metal layer on a substrate via electroless plating; and in particular to a method for forming a patterned metal layer on a substrate via printing and electroless plating.

Another objective of the present invention is to propose a method for forming a metal conductor in a through hole of a substrate.

Another objective of the present invention is to propose an ink composition that can be applied to the aforesaid method for forming a metal layer on a substrate.

Still another objective of the present invention is to propose a catalytic aqueous solution that can be applied to the aforesaid method for forming a metal conductor in a through hole of a substrate.

A further objective of the present invention is to propose a copolymer of an ethylenically unsaturated monomer and a hydrophilic monomer deposited with particles of catalytic metal, wherein the particles of catalytic metal are Au, Ag, Pd, Pt, or Ru; and the copolymer has a lower critical solution temperature (LCST), so that the copolymer is hydrophilic when temperature is lower than the LCST and becomes hydrophobic when temperature is higher than the LCST.

The ink composition and catalytic aqueous solution proposed in the present invention contain the copolymer deposited with particles of catalytic metal proposed in the present invention, which is hydrophilic when temperature is at a low temperature such as room temperature, so that the catalytic metal particles deposited on the copolymer are uniformly distributed in the ink composition and the aqueous solution. The copolymer will become hydrophobic when the temperature is elevated such as 75° C., and thus has a better binding strength to the substrate, which in turn enhances the binding strength between the electroless plated metal layer to the substrate. The LCST of the copolymer is dependent on pH, e.g. the LCST decreases as pH increases. In one of the preferred embodiments of the present invention the electroless plating was carried out at 35° C. and pH of 12.5, under such conditions the copolymer was hydrophobic, thus has a better binding strength to the substrate, which in turn enhances the binding strength between the electroless plated metal layer to the substrate

DETAILED DESCRIPTION OF THE INVENTION

Figure 1:
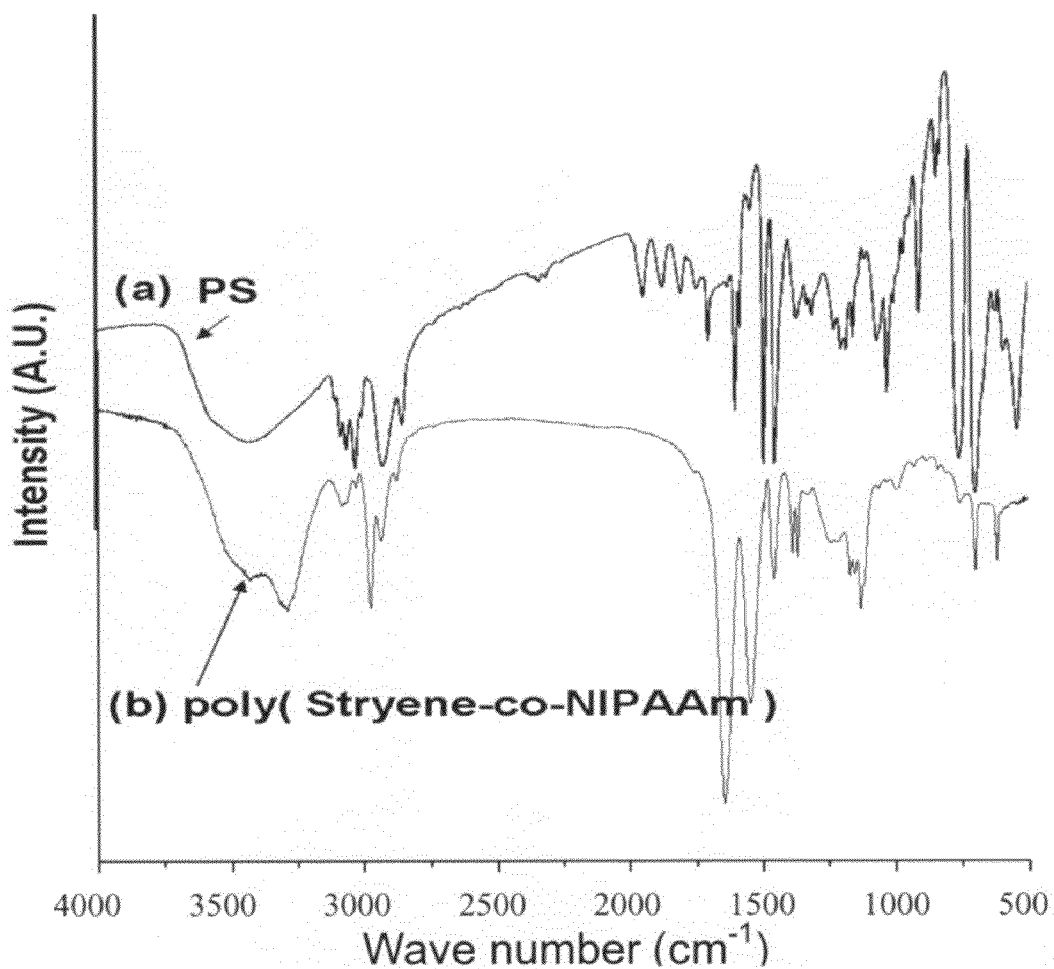
FIG. 1 shows FT-IR spectra of polystyrene (a) and poly(styrene-co-NIPAAm) (b) prepared in Example 1 of the present invention.

The present invention provides a method for forming a metal pattern on a substrate, comprising the following steps:
a) contacting a surface of a substrate with an ink composition;
b) drying the ink composition on the surface of the substrate;
c) contacting the surface of the substrate having the dried ink composition with an electroless plating solution, so as to form a metal film on the dried ink composition;
   wherein the ink composition comprises a liquid phase comprising water as a major portion; and, dissolved in said liquid phase, components (i) and (ii), or component (iii), wherein the component (i) is a sulfate terminated copolymer of an ethylenically unsaturated monomer and a hydrophilic monomer; the component (ii) is a catalytic metal precursor; and the component (iii) is a copolymer of an ethylenically unsaturated monomer and a hydrophilic monomer deposited with particles of catalytic metal, wherein the catalytic metal precursor (ii) is a salt or halide of gold (Au), silver (Ag), palladium (Pd), platinum (Pt), or ruthenium (Ru); the particles of catalytic metal in (iii) are Au, Ag, Pd, Pt, or Ru; and the copolymer in each of the components (i) and (iii) has a lower critical solution temperature (LCST), which is hydrophilic when temperature is lower than the LCST and becomes hydrophobic when temperature is higher than the LCST.

Preferably, the ink composition comprises the components (i) and (ii) dissolved in said liquid phase, and a weight ratio of the component (i) to the component (ii) ranges from 1:1 to 20:1.

Preferably, the ink composition comprises the component (iii) dissolved in said liquid phase.

Preferably, the hydrophilic monomer of the copolymer can be polymerized to form a homopolymer, and said homopolymer has a lower critical solution temperature (LCST), and said homopolymer is hydrophilic when temperature is lower than the LCST and becomes hydrophobic when temperature is higher than the LCST.

Preferably, said hydrophilic monomer is N-isopropylacrylamide.

Preferably, the copolymer (i) is a sulfate terminated poly(styrene-co-N-isopropylacrylamide) with a number average molecular weight ranging from 500 to 5000.

Preferably, the copolymer (iii) is poly(styrene-co-N-isopropylacrylamide) deposited with particles of catalytic metal, which has a number average molecular weight ranging from 500 to 5000.

Preferably, the catalytic metal precursor (ii) is a palladium salt or palladium halide, and the catalytic metal particles in the component (iii) are palladium.

Preferably, the electroless plating solution in step c) is an electroless copper plating solution, and the metal film is a copper film.

Preferably, the electroless plating solution in step c) is an electroless nickel plating solution, and the metal film is a nickel film.

Preferably, the electroless plating solution in step c) is maintained at a temperature of 35-95° C.

Preferably, the substrate is made of epoxy resin, poly(ethylene terephthalate), polyimide or glass.

Preferably, step a) comprises printing the ink composition on the surface of the substrate to form a pattern of the ink composition, and the metal film formed in step c) is formed imagewise according to the pattern.

Preferably, the LCST of the copolymer is 28-50° C.

Preferably, the LCST of the copolymer is dependent on pH value.

Preferably, the LCST of the copolymer decreases as pH value increases.

The present invention also provides a method of forming a metal conductor in a through hole of a substrate comprising the following steps:
A) immersing a substrate having a through hole in a PTH catalytic aqueous solution;
B) washing surfaces of the substrate with water to remove the PTH catalytic aqueous solution therefrom;
C) immersing the washed substrate in an electroless plating solution to form a metal conductor in the through hole;
   wherein the PTH catalytic aqueous solution comprises a liquid phase comprising water as a major portion; and, dissolved in said liquid phase, a copolymer of an ethylenically unsaturated monomer and a hydrophilic monomer deposited with particles of catalytic metal, wherein the particles of catalytic metal are Au, Ag, Pd, Pt, or Ru; and the copolymer has a lower critical solution temperature (LCST), which is hydrophilic when temperature is lower than the LCST and becomes hydrophobic when temperature is higher than the LCST.

Preferably, step A) further comprises, prior to immersing in the PTH catalytic aqueous solution, immersing the substrate in a conditioning agent solution, and washing the surfaces of the substrate to remove the conditioning agent solution therefrom.

The present application further provides a copolymer of an ethylenically unsaturated monomer and a hydrophilic monomer deposited with particles of catalytic metal, wherein the particles of catalytic metal are Au, Ag, Pd, Pt, or Ru; and the copolymer has a lower critical solution temperature (LCST), which is hydrophilic when temperature is lower than the LCST and becomes hydrophobic when temperature is higher than the LCST.

The present invention can be better understood through the following examples, which are merely illustrative and not for restricting the scope of the present invention.

EXAMPLE 1

Preparation of Temperature Responsive Catalyst

1. Preparation of Temperature Responsive Copolymer 54 ml of $3 \times 10^{-3}$ M aqueous KPS solution (potassium persulfate) was introduced in a flask. To the KPS solution a mixture of styrene monomer (SM) and N-isopropylacrylamide monomer (NIPAAm) was added, and a free radical copolymerization was carried out in the resulting mixture at 75° C. for eight hours to form a sulfate terminated poly(styrene-co-N-isopropylacrylamide). The moles of monomers added, the number average molecular weight and polydispersity of the copolymers are listed in Table 1.

In this example four samples of poly(styrene-co-N-isopropylacrylamide) were prepared with various molar ratios of styrene to NIPAAm. GPC analyses were conducted to determine the number average molecular weight and polydispersity of the copolymers. It can be seen from Table 1 that copolymers having larger molecular weight can be prepared by increasing the molar ratio of NIPAAm, wherein the number average molecular weight of the copolymers ranges from 738 to 2119, and the polydispersity ranges from 1.71 to 1.99.

TABLE 1

| Sample | Styrene (mole) | NIPAAm (mole) | Mn | Polydispersity |
|---|---|---|---|---|
| 1 | 0.5 | 0.125 | 738 | 1.99 |
| 2 | 0.5 | 0.250 | 1033 | 1.71 |
| 3 | 0.5 | 0.5 | 1692 | 1.81 |
| 4 | 0.5 | 1 | 2119 | 1.96 |

2. Preparation of Temperature Responsive Catalyst 30 ml of the poly(styrene-co-N-isopropylacrylamide) solution resulting from the free radical copolymerization (Sample 2 in Table 1) was mixed with 30 ml of palladium chloride aqueous solution (1200 ppm) at 75° C., and left for reaction for 10 minutes to obtain poly(styrene-co-N-isopropylacrylamide) deposited with palladium nano particles.

3. FT-IR Analysis

FIG. 1 shows FT-IR spectra of polystyrent (PS) (a) and poly(Stryene-co-NIPAAm) (Sample 2 in Table 1) (b). The spectrum (a) of polystyrene shows a stretching-vibration characteristic absorption peak at 3000 $cm^{-1}$, a characteristic absorption peak of C—C in the aromatic ring at 1470 $cm^{-1}$, a characteristic absorption peak of $CH_3$ at 1454 $cm^{-1}$, a characteristic absorption peak of $CH_2$ at 1330 $cm^{-1}$, and a characteristic absorption peak of C—H outside the benzene ring at 700 $cm^{-1}$. The spectrum (b) of poly(stryene-co-NIPAAm) shows absorptions of copolymerized NIPAAm monomer in addition to the absorptions of PS shown in the spectrum (a), which are characteristic absorption peaks of amino group at 1650 $cm^{-1}$ and 1550 $cm^{-1}$, bending-vibration characteristic absorption peaks of isopropylacrylamide group at 1387 $cm^{-1}$ and 1367 $cm^{-1}$, characteristic absorption peak absorption of C—N at 2970 $cm^{-1}$, and stretching-vibration characteristic absorption peaks of N—H bweteen 3100-3700 $cm^{-1}$. The data shown in FIG. 1 evidence that poly(stryene-co-NIPAAm) has been successfully synthesized in this example.

4. TEM Analysis

Figure 2:
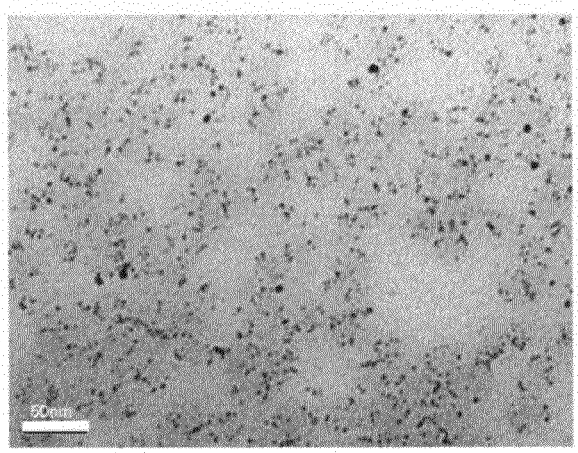
FIG. 2 is an image taken by transmission electron microscopy (TEM) showing poly(styrene-co-NIPAAm) deposited with palladium nano particles prepared in Example 1 of the present invention.

FIG. 2 is an image taken by transmission electron microscopy (TEM) showing poly(styrene-co-NIPAAm) deposited with palladium nano particles prepared in step 2 of this example. As shown in FIG. 2 palladium nano particles deposited on the copolymer does not aggregated together and have a size of about 2-5 nm. It is believed that the palladium nano particles are formed by a reduction reaction in the presence of sulfate groups of the copolymer as a reducing agent and in the absence of any other additional reducing agent. Moreover, the hydrophilic monomer, NIPAAm, has a hydrophilic functional group, which helps the copolymer deposited with palladium nano particles uniformly distributed in an aqueous solution.

5. XRD Analysis

Figure 3:
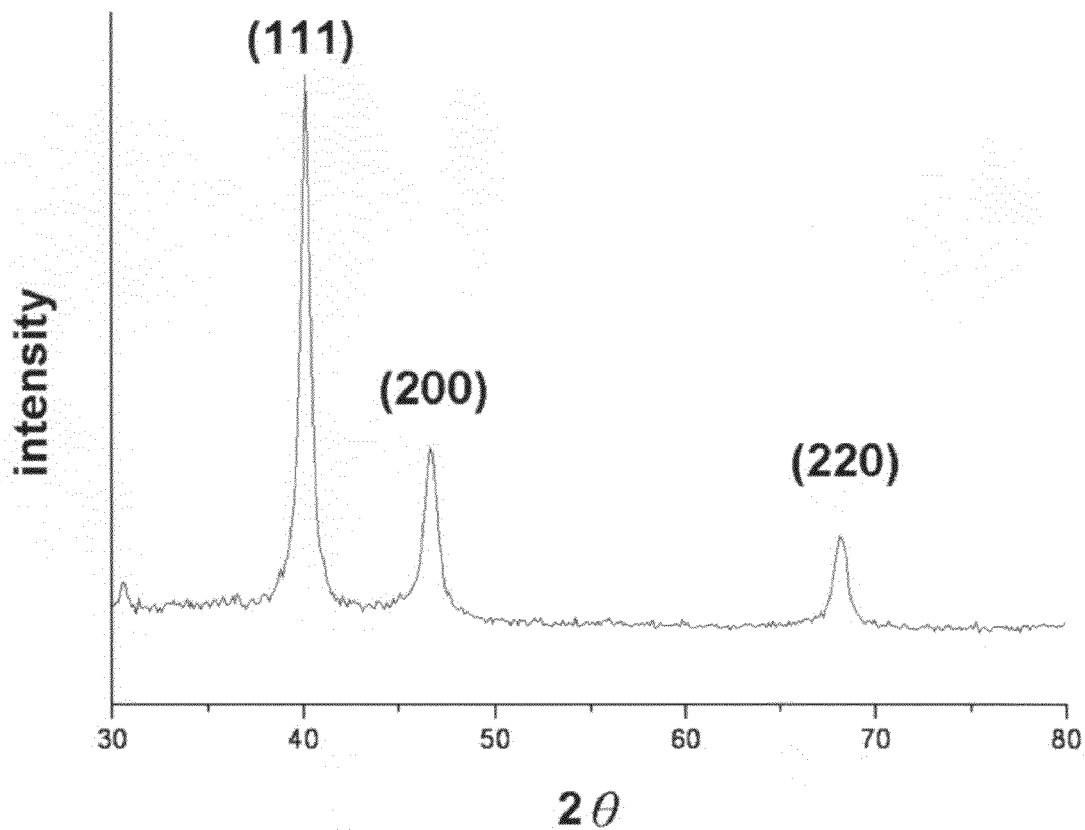
FIG. 3 shows an XRD spectrum of poly(styrene-co-NIPAAm) deposited with palladium nano particles prepared in Example 1 of the present invention.

FIG. 3 shows an XRD spectrum of poly(styrene-co-NIPAAm) deposited with palladium nano particles prepared in step 2 of this example. It can be seen from FIG. 3 that the peaks at 2θ angles of 40.14, 46.70, and 68.14 are 2θ angles of palladium by matching each characteristic peak in the diffraction spectrum with the JCPDS files, which represent crystallization orientations of (111), (200) and (220), respectively. The palladium has a face-centered cubic structure in view of the lattice orientations. The XRD analysis reveals that the copolymers prepared in step 1 of this example can reduce palladium ions to elemental palladium in the absence of an additional added reducing agent.

6. UV Analysis

Figure 4:
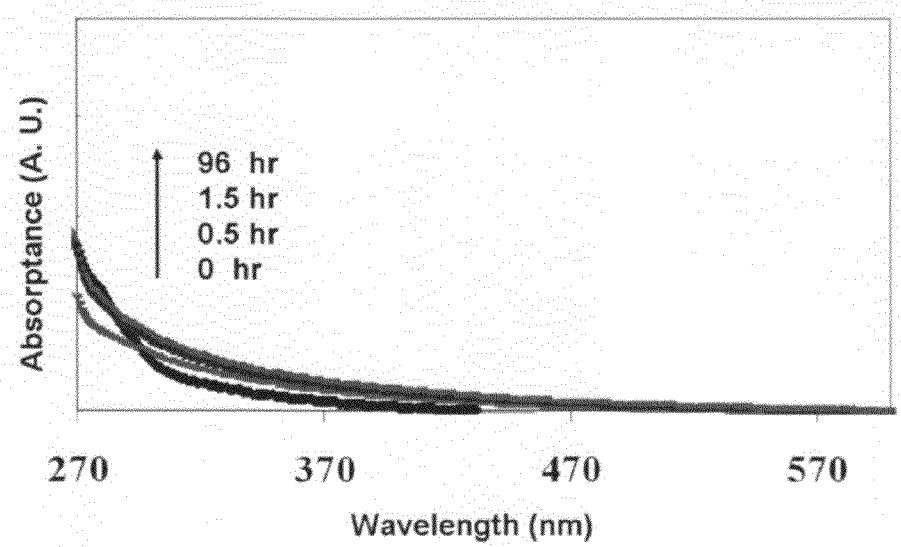
FIG. 4 shows UV-vis spectra of a solution of poly(styrene-co-NIPAAm) deposited with palladium nano particles prepared in Example 1 of the present invention, which are taken at the time when the solution has been aerated for 0, 0.5, 15 and 96 hours.

FIG. 4 shows UV-vis spectra of a solution of poly(styrene-co-NIPAAm) deposited with palladium nano particles prepared in step 2 of this example, which are taken at the time when the solution has been aerated for 0, 0.5, 15 and 96 hours. No peak at 440 nm can be seen in the spectra of FIG. 4, which is the absorbance of palladium ion ($Pd^{2+}$). This indicates that the palladium nano particles deposited on the poly(styrene-co-NIPAAm) of the present invention are stable during the 96-hour aeration. It is known that the conventional colloidal tin-palladium particles will aggregate and form agglomerates during aeration, and eventually lose its catalytic activity after sedimentation thereof.

7. Temperature Response of the Copolymer's Hydrophilic/Hydrophobic Property

Figure 5:
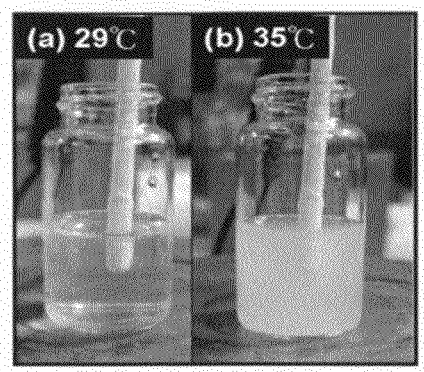
FIG. 5 show photographs (a) and (b) of a solution of poly(styrene-co-NIPAAm) deposited with palladium nano particles prepared in Example 1 of the present invention at 29° C. (a) and 35° C. (b), respectively.

FIG. 5 show photographs (a) and (b) of a solution of poly(styrene-co-NIPAAm) deposited with palladium nano particles prepared in step 2 of this example at 29° C. (a) and 35° C. (b), respectively. The solution shown in FIG. 5(a) is clear and transparent, but FIG. 5(b) is not. It is believe that the comonomer NIPPAAm of the copolymer synthesized in this example is temperature responsive as to its hydrophilic/hydrophobic property, so that the solution of the copolymer changes its phase when the temperature is increased from 29° C. to 35° C., wherein the copolymer changes from hydrophilic to hydrophobic. As a result, the solution of poly(styrene-co-NIPAAm) deposited with palladium nano particles prepared in step 2 of this example will have a better adhesion strength to a hydrophobic substrate by increasing the temperature after it has been applied to the substrate, and thus is more suitable for use in the electroless plating for the fabrication of the conventional printed circuit boards.

8. pH Response of the Copolymer's Hydrophilic/Hydrophobic Property

Figure 6:
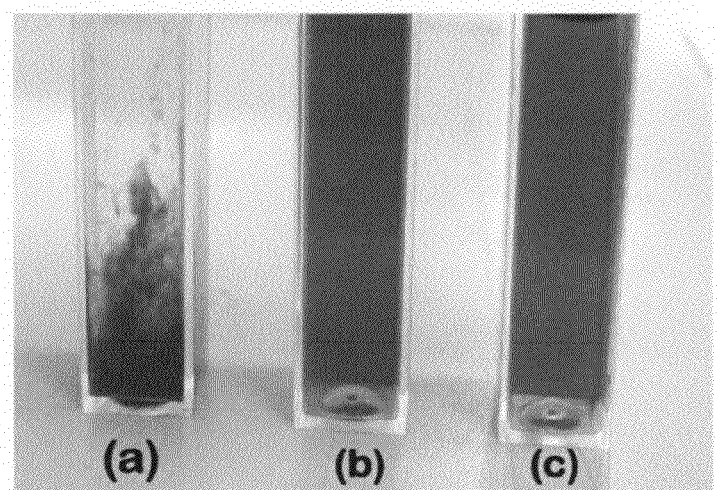
FIG. 6 show photographs (a), (b) and (c) of a solution of poly(styrene-co-NIPAAm) deposited with palladium nano particles prepared in Example 1 of the present invention at 28° C. and pH of 13, 5 and 1, respectively.

FIG. 6 show photographs (a), (b) and (c) of a solution of poly(styrene-co-NIPAAm) deposited with palladium nano particles prepared in step 2 of this example at 28° C. and pH of 13, 5 and 1, respectively. The solution of the copolymer is a clear single phase at pH of 1 (FIG. 6(c)) and pH of 5 (FIG. 6(b)), and turns to a two-phase liquid with sedimentation (FIG. 6(a)). That is the hydrophilic/hydrophobic property of the copolymer is pH responsive. The LCST of the copolymer decrease as the pH value increases at a selected temperature, and the copolymer changes from hydrophilic to hydrophobic when pH is increased from 1 to 13 at the selected temperature.

EXAMPLE 2

Ink Composition for Inkjet Printer

The solution of poly(styrene-co-NIPAAm) deposited with palladium nano particles prepared in step 2 of Example 1 was added with isopropyl to adjust the surface tension thereof to 30-35 N/m, and an ink composition for inkjet printer was thus obtained. The ink composition was filled into an ink cassette of an inkjet printer (EPSON R230 or EPSON C65, and was ready to print a pattern on a substrate. The composition of the ink composition is listed in Table 2.

TABLE 2

| Ink composition for inkjet printer | |
|---|---|
| Component | wt % |
| Water | 93 |
| poly(styrene-co-NIPAAm) | 1.64 |
| Palladium | 0.36 |
| Isopropyl | 5 |

EXAMPLE 3

Electroless Copper Plating on a Non-Conductor Substrate

Figure 7:
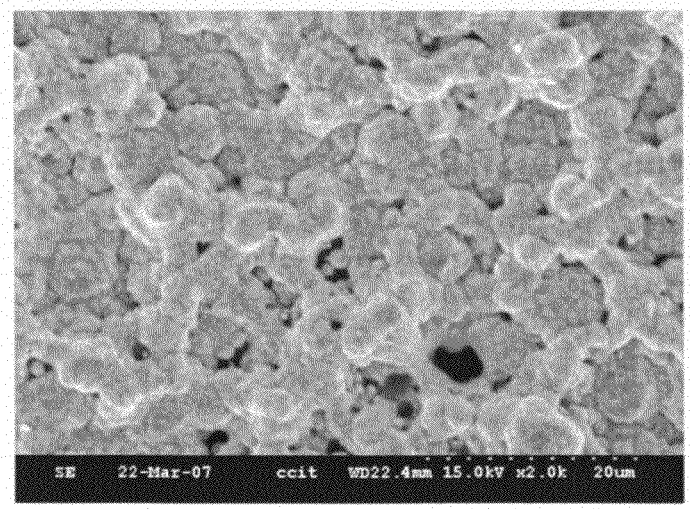
FIG. 7 is an image taken by scanning electron microscopy (SEM) showing a metal layer of copper formed on a FR4 substrate in Example 3 of the present invention.

A non-conductor substrate FR4 (fiber glass/epoxy resin composite) was directly immersed in the solution of the poly (styrene-co-NIPAAm) deposited with palladium nano particles prepared in step 2 of Example 1 at room temperature for five minutes, and the FR4 substrate was removed from the solution and left dry at room temperature, followed by immersing in an electroless copper plating solution for 15 minutes. In this example, Circuposit 680, a commercially available electroless copper plating solution (Rohm Hass Co., U.S.A.) was used, and proper additives had to be added into the plating solution in order to make the solution adequate for use with polymer substrates; for example, glycerin was added so as to lower surface tension of the plating solution; butanol was added as a co-solvent, or for increasing wetting capability and lowering surface tension of the plating solution, while polyethylene glycol was added as a wetting agent. The electroless copper plating solution used in this example was prepared by adding glycerin (4 wt %), n-butanol (25 wt %); and polyethylene glycol (weight average molecular weight of 2200, 6 wt %) into Circuposit 680. The FR4 substrate was removed from said electroless copper plating solution, and then a layer of copper was found to have been deposited on the surfaces of the FR4 substrate, as shown in the TEM image of FIG. 7.

EXAMPLE 4

Preparation of the Ink Composition and the Nickel Metal Pattern

Figure 8:
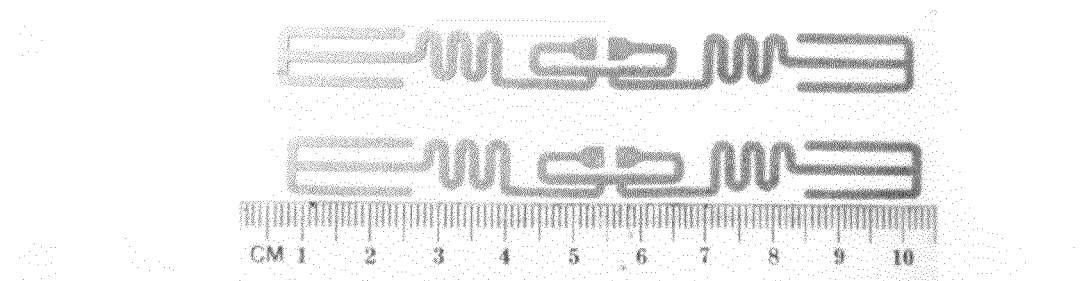
FIG. 8 is a photograph that shows a metal pattern made of nickel formed on a PET substrate in Example 4 of the present invention.

The ink composition prepared in Example 2 was used to print a pattern on a PET substrate, and the pattern was dried by evaporation of water contained therein at room temperature to obtain a hardened pattern of thin film. The PET substrate with the hardened pattern was then immersed into a 75° C. electroless nickel plating solution having the composition listed in Table 3 below for 10 minutes. Subsequently, a layer of nickel was observed to have been deposited evenly on and combined stably with the pattern on the PET substrate, whereas the rest of the surface of the PET substrate without the pattern did not have any nickel deposited thereon, as shown in FIG. 8.

TABLE 3

| Composition of electroless nickel plating solution | |
|---|---|
| Components | Concentration |
| Nickel Sulfate ($NiSO_4 \cdot 6H_2O$) | 30 g/L |
| Sodium Hypophosphite ($NaH_2PO_2 \cdot H_2O$) | 30 g/L |
| Sodium Lactate ($C_3H_5O_3Na$) | 40 g/L |
| Amino acetate ($C_2H_5O_2N$) | 10 g/L |
| Aqueous Ammonia ($NH_4OH$) | adjusting pH to 5 |

EXAMPLE 5

Preparation of the Ink Composition and the Copper Metal Pattern

Figure 9:
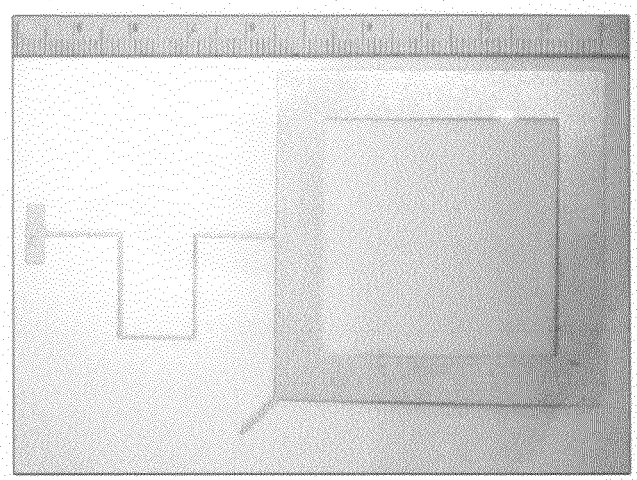
FIG. 9 is a photograph that shows a metal pattern made of copper formed on a PET substrate in Example 5 of the present invention.

The ink composition prepared in Example 2 was used to print a pattern on a PET substrate, and the pattern was dried by evaporation of water contained therein at room temperature to obtain a hardened pattern of thin film. The PET substrate with the hardened pattern was then immersed into a 35° C. electroless copper plating solution having the composition listed in Table 4 below for 15 minutes. Subsequently, a layer of copper was observed to have been deposited evenly on and combined stably with the pattern on the PET substrate, whereas the rest of the surface of the PET substrate without the pattern did not have any copper deposited thereon, as shown in FIG. 9.

TABLE 4

| Composition of electroless nickel plating solution | |
|---|---|
| Component | Concentration |
| Copper sulfate ($CuSO_4 \cdot 5H_2O$) | 15 g/L |
| Ethylenediaminetetraacetic acid (EDTA) | 30 g/L |
| Formaldehyde aqueous solution (37 wt % HCHO) | 10 ml/L |
| Sodium hydride (NaOH) | adjusting pH to 12.5 |

EXAMPLE 6

Copper Conductor Formed by PTH

Figure 10:
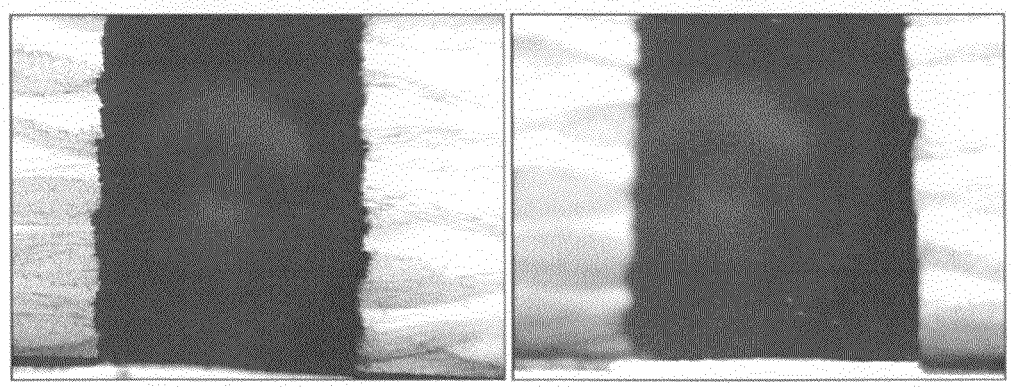
FIG. 10 is an image taken by electron microscopy (OM) that shows metal conductors made of copper formed in through holes of a FR4 substrate according to Example 6 of the present invention.

A FR4 substrate having through holes was immersed in a conditioning agent solution (Rockwood Electronchemicals Asia Ltd., Taiwan, Code number: ML371) at 60° C. for 5 minutes, and the FR4 substrate was removed therefrom and washed with water. Subsequently, the FR4 substrate was immersed in a micro etching solution (Rockwood Electronchemicals Asia Ltd., Taiwan, Code number: QH-46) at 40° C. for one minute, removed therefrom and washed with water. Then the FR4 substrate was immersed in the solution of poly(styrene-co-NIPAAm) deposited with palladium nano particles prepared in step 2 of Example 1 for five minutes, removed therefrom and washed with water. Finally, the FR4 substrate was immersed in the electroless copper plating solution of Table 4 at 35° C. for 15 minutes to form copper conductors in the through holes of the FR4 substrate, as shown in FIG. 10.

Several advantages of the present invention are listed as follows:

1. The copolymer prepared with an ionic initiator have functional group ($SO^{4-}$) with reducing ability, so that noble metal ions can be reduced to elemental noble metal and deposited thereon in the absence of an additional added reducing agent.
2. The copolymer prepared with a hydrophilic comonomer having a temperature responsive property such as NIPAAm, so that the solution of the copolymer is a clear single phase at room temperature with noble metal nano particles deposited thereon stably distributed therein in the absence of an additional dispersant added.
3. The copolymer is able to reduce various noble metal ions such as Au, Ag and Pd to elemental form, so that nano particles of various noble metals having catalytic activity are deposited thereon.
4. The copolymer with noble metal nano particles deposited thereon is stably dispersed in an aqueous solution even after 96-hour aeration.
5. The preparation of the copolymer is simple and the cost thereof is low, so that it suitable to be industrialized.
6. The noble metal nano particles deposited on the copolymer have a size of about 5-100 nm, so that their catalytic activity is high.
7. The copolymer can be prepared with various functional groups to enhance its binding strength to a substrate.
8. The process of the present invention can be used in the metallization of various substrates such as PI, PET, PEN and RF4.
9. The copolymer with noble metal nano particles deposited thereon can be used as a catalyst in the PTH process of forming a metal conductor in a through hole of a substrate by electroless plating.
10. The copolymer with noble metal nano particles deposited thereon can be used to form a metal pattern of a circuit on a surface of substrate with a low cost by inkjet printing or roll-to-roll printing and electroless printing.

The invention claimed is:

1. A method for forming a metal pattern on a substrate, comprising the following steps:
   a) contacting a surface of a substrate with an ink composition;
   b) drying the ink composition on the surface of the substrate;
   c) contacting the surface of the substrate having the dried ink composition with an electroless plating solution, so as to form a metal film on the dried ink composition;
   wherein the ink composition comprises a liquid phase comprising water as a major portion; and, dissolved in said liquid phase, components (i) and (ii), or component (iii);
   wherein the component (i) is a sulfate terminated copolymer of an ethylenically unsaturated monomer and a hydrophilic monomer; the component (ii) is a catalytic metal precursor;
   and the component (iii) is a copolymer of an ethylenically unsaturated monomer and a hydrophilic monomer deposited with particles of catalytic metal,
   wherein the catalytic metal precursor (ii) is a salt or halide of gold (Au), silver (Ag), palladium (Pd), platinum (Pt), or ruthenium (Ru); the particles of catalytic metal in (iii) are Au, Ag, Pd, Pt, or Ru; and the copolymer in each of the components (i) and (iii) has a lower critical solution temperature (LCST), which is hydrophilic when temperature is lower than the LCST and becomes hydrophobic when temperature is higher than the LCST.

2. The method of claim 1, wherein the ink composition comprises the component (iii) dissolved in said liquid phase.

3. The method of claim 2, wherein, when the hydrophilic monomer of the copolymer is polymerized to form a homopolymer, said homopolymer has a lower critical solution temperature (LCST), wherein said homopolymer is hydrophilic when temperature is lower than the LCST and becomes hydrophobic when temperature is higher than the LCST.

4. The method of claim 3, wherein said hydrophilic monomer is N-isopropylacrylamide.

5. The method claim 4, wherein the copolymer (iii) is poly(styrene-co-N-isopropylacrylamide) deposited with particles of catalytic metal, which copolymer (iii) has a number average molecular weight ranging from 500 to 5000.

6. The method of claim 1, wherein the catalytic metal precursor (ii) is a palladium salt or palladium halide, and the catalytic metal particles in the component (iii) are palladium.

7. The method of claim 6, wherein the electroless plating solution in step c) is an electroless copper plating solution, and the metal film is a copper film.

8. The method of claim 6, wherein the electroless plating solution in step c) is an electroless nickel plating solution, and the metal film is a nickel film.

9. The method of claim 1, wherein the electroless plating solution in step c) is maintained at a temperature of 35-95° C.

10. The method of claim 1, wherein the substrate is made of epoxy resin, poly(ethylene terephthalate), polyimide or glass.

11. The method of claim 1, wherein step a) comprises printing the ink composition on the surface of the substrate to form a pattern of the ink composition, and the metal film formed in step c) is formed imagewise according to the pattern.

12. The method of claim 1, wherein the LCST is 28-50° C.

13. The method of claim 1, wherein the LCST is dependent on pH value.

14. The method of claim 13, wherein the LCST decreases as pH value increases.

* * * * *